United States Patent
Kanaya et al.

(10) Patent No.: US 8,289,681 B2
(45) Date of Patent: Oct. 16, 2012

(54) CONTROL UNIT SIDE BY SIDE

(75) Inventors: Hiroki Kanaya, Kitakyushu (JP); Takahiro Shimozu, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 127 days.

(21) Appl. No.: 12/985,346

(22) Filed: Jan. 6, 2011

(65) Prior Publication Data
US 2011/0164350 A1    Jul. 7, 2011

(30) Foreign Application Priority Data

Jan. 7, 2010 (JP) .................. 2010-002325
Oct. 29, 2010 (JP) .................. 2010-242980

(51) Int. Cl.
*H02B 1/26* (2006.01)
(52) U.S. Cl. ........ 361/624; 361/610; 361/611; 361/637; 318/34; 307/155; 363/144; 200/336
(58) Field of Classification Search .......... 361/610–611, 361/621–622, 624, 632, 637, 639, 648, 650, 361/668, 671
See application file for complete search history.

(56) References Cited

U.S. PATENT DOCUMENTS

| 5,025,171 | A * | 6/1991 | Fanta et al. | 307/150 |
| 5,434,369 | A * | 7/1995 | Tempco et al. | 200/50.26 |
| 5,895,987 | A * | 4/1999 | Lo et al. | 307/125 |
| 7,026,558 | B1 * | 4/2006 | Andreyo | 200/17 R |
| 8,054,606 | B2 * | 11/2011 | Morris et al. | 361/115 |
| 8,139,345 | B2 * | 3/2012 | Christensen et al. | 361/615 |
| 8,199,022 | B2 * | 6/2012 | Morris et al. | 340/648 |
| 2008/0062620 | A1 * | 3/2008 | Parker et al. | 361/605 |
| 2010/0301980 | A1 * | 12/2010 | Bergamini et al. | 336/61 |
| 2012/0119573 | A1 * | 5/2012 | Turudic | 307/10.1 |

FOREIGN PATENT DOCUMENTS

JP    2004-265841    9/2004

* cited by examiner

*Primary Examiner* — Courtney Smith
(74) *Attorney, Agent, or Firm* — Ditthavong Mori & Steiner, P.C.

(57) ABSTRACT

This disclosure discloses a control unit comprising a plurality of controllers, each controller having a bus bar portion having: a left and a right bus bar holder; an upper and an lower common bus bar; an upper and an lower rotating bus bar; a upper and a lower connecting body; wherein each bus bar holder has protrusions forming a gap, the upper and the lower rotating bus bar are configured to be changed between a first mode that the upper and the lower rotating bus bar engages rotatably with the left bus bar holder, and a second mode that the upper and the lower rotating bus bar are tightened and secured to the left bus bar holder, and the upper and the lower rotating bus bar of one controller in the second mode is connected in close contact with the upper and the lower common bus bar of another controller.

5 Claims, 2 Drawing Sheets

[FIG. 1]
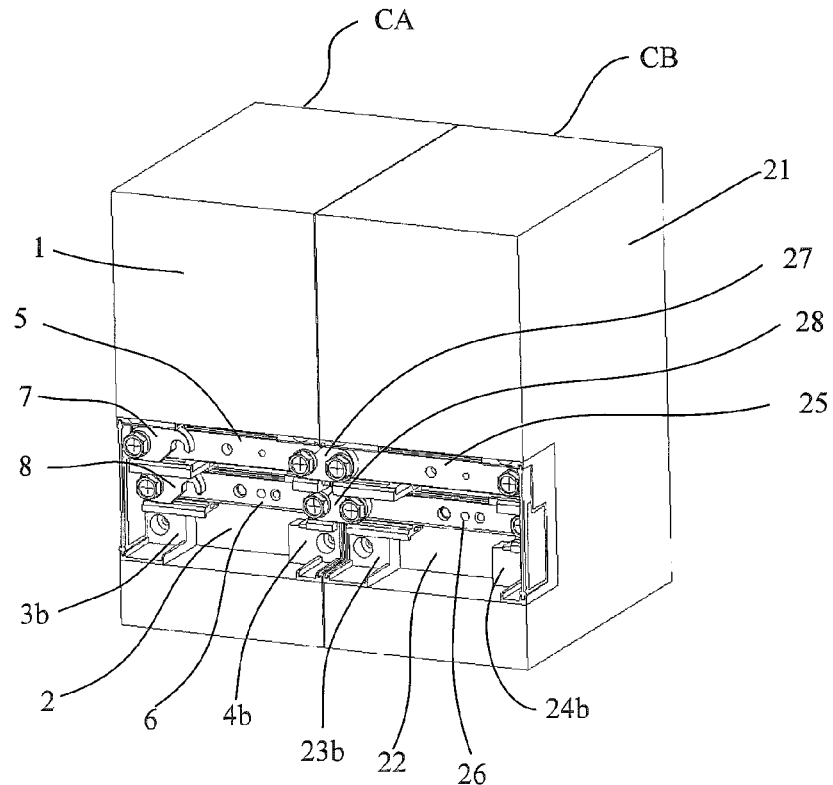
[FIG. 2]
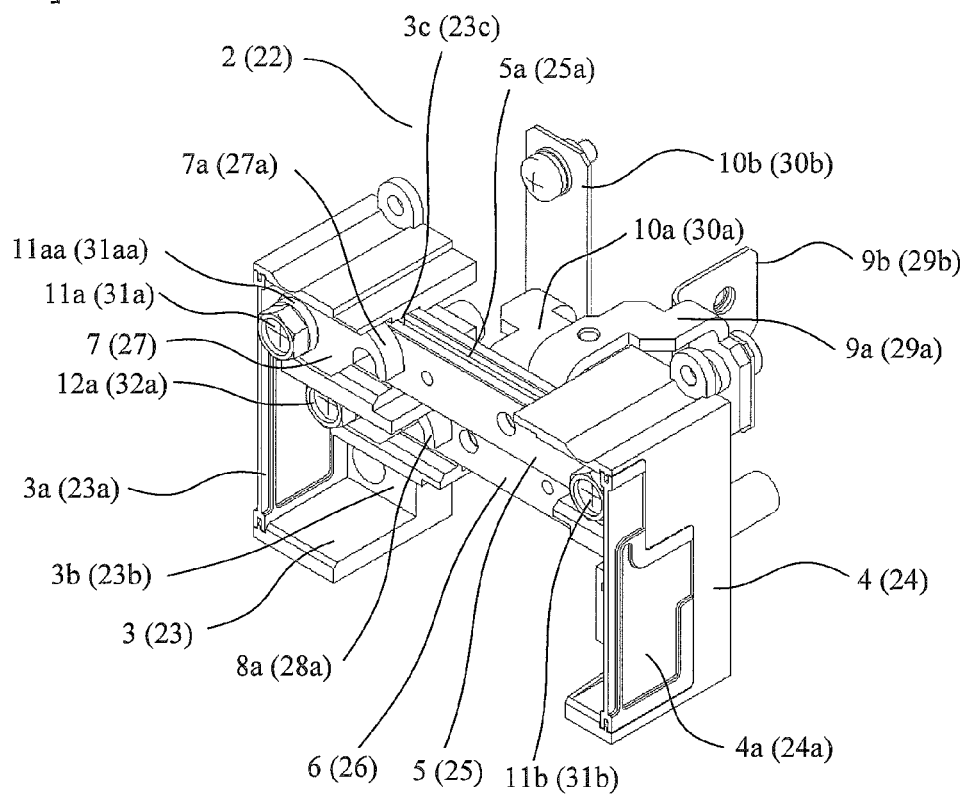

[FIG. 3]
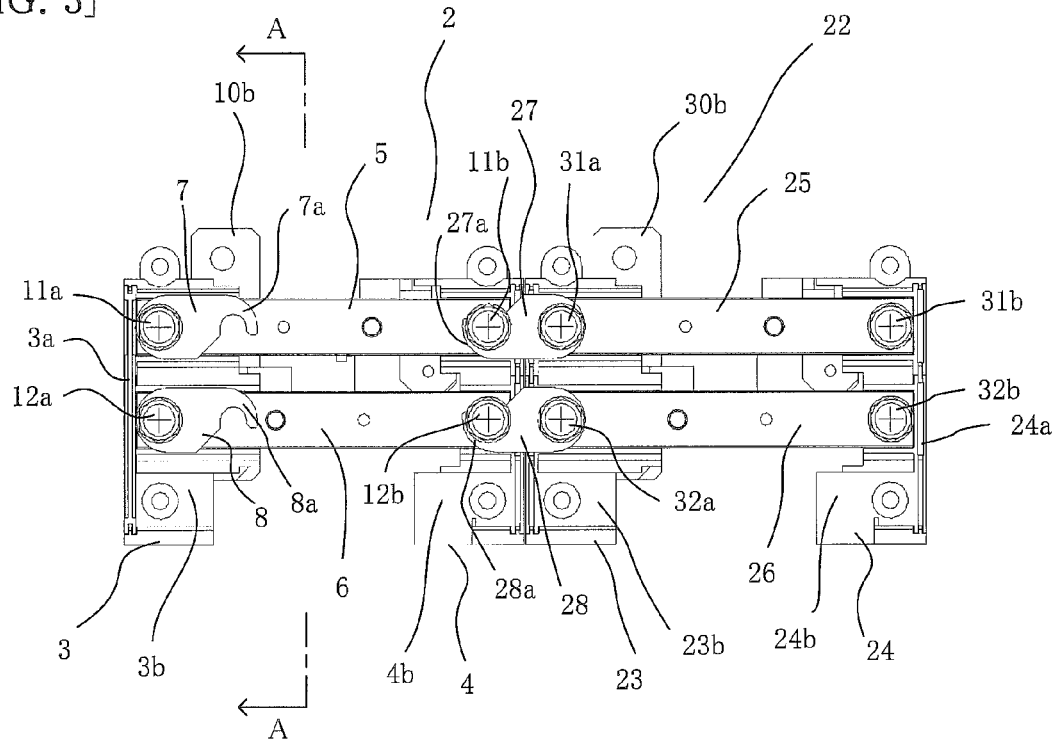
[FIG. 4]
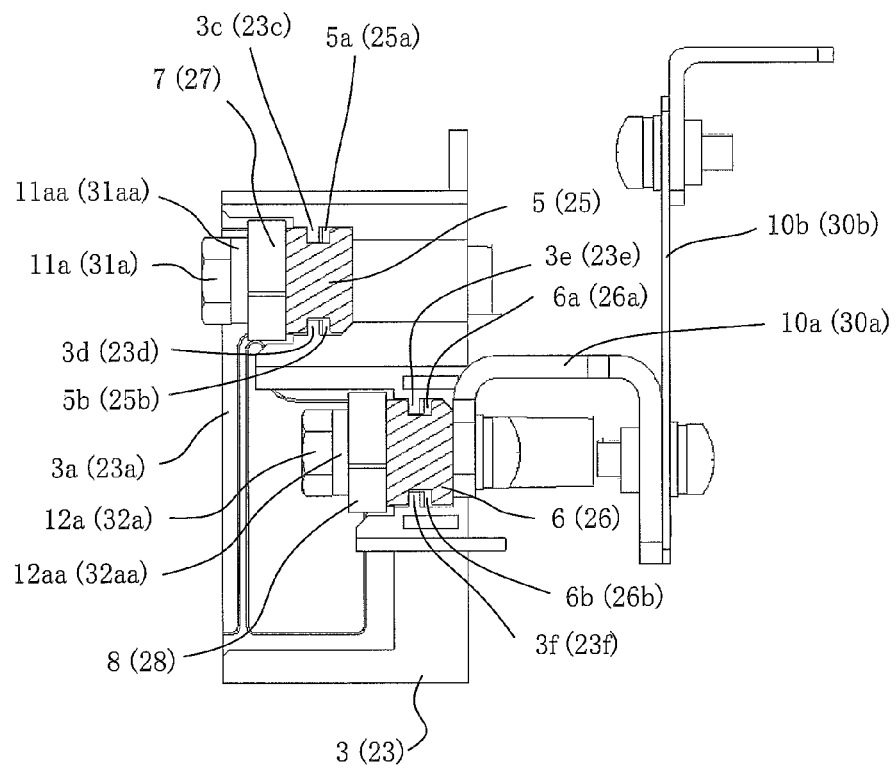

CONTROL UNIT SIDE BY SIDE

CROSS-REFERENCE TO RELATED APPLICATION

The present application claims priority from Japanese Patent Applications No. 2010-002325, which was filed on Jan. 7, 2010, and No. 2010-242980, which was filed on Oct. 29, 2010, the disclosures of which are incorporated herein by reference in their entirety.

BACKGROUND OF THE INVENTION

1. Field of the Invention

The present invention relates to a control unit.

2. Description of the Related Art

When pluralities of motors are driven, for example, pluralities of controllers configured to control respectively the motors are arranged in parallel, in a so-called side-by-side configuration. In such a case, power supply terminals of these controllers mounted side-by-side are connected by bus bars for power supply.

JP, A, 2004-265841 discloses one example of a configuration used to connect the power supply terminals using the bus bars.

SUMMARY OF THE INVENTION

According to the first aspect of the present invention, there is provided a control unit comprising a plurality of controllers, each controller having a bus bar portion having: a left and a right bus bar holder; an upper and an lower common bus bar; an upper and an lower rotating bus bar; a upper and a lower connecting body; wherein each bus bar holder has protrusions forming a gap, the upper and the lower rotating bus bar are configured to be changed between a first mode that the upper and the lower rotating bus bar engages rotatably with the left bus bar holder, and a second mode that the upper and the lower rotating bus bar are tightened and secured to the left bus bar holder, and the upper and the lower rotating bus bar of one controller in the second mode is connected in close contact with the upper and the lower common bus bar of another controller.

According to the present invention, an upper common bus bar, a lower common bus bar, an upper rotating bus bar, and a lower rotating bus bar are configured to be a floating structure and a hook disposed on only one side engages by a rotation, making it possible to provide a control unit having a plurality of controllers that are disposed side by side that readily forgives machining errors, such as the tolerance of a target object, permits easy removal, and reliably maintains the contact surface area.

BRIEF DESCRIPTION OF THE DRAWINGS

FIG. 1 is a perspective view illustrating the side-by-side configuration of two controllers placed side-by-side, according to the present invention.

FIG. 2 is a perspective view illustrating the configuration of the bus bar portion of either one of the controllers of FIG. 1.

FIG. 3 is a front view illustrating the connected state of the bus bar portions of both controllers.

FIG. 4 is a cross-sectional view taken along line A-A of FIG. 3.

DESCRIPTION OF THE EMBODIMENTS

The following describes an embodiment of the present invention with reference to accompanying drawings.

Embodiment 1

FIG. 1 is a perspective view illustrating the side-by-side configuration of two controllers placed side-by-side, according to a control unit of the present invention. FIG. 2 is a perspective view illustrating the configuration of the bus bar portion of a controller of FIG. 1. Since the bus bar portions of the two controllers have the same configuration, only one bus bar portion is shown. The reference numerals in parentheses indicate the reference numerals for the other bus bar portion. FIG. 3 is a front view illustrating the connected state of the bus bar portions of both controllers. FIG. 4 is a cross-sectional view taken along line A-A of FIG. 3.

In FIG. 1 to FIG. 4, motor controllers CA and CB have the same or substantially the same configuration, and are placed side-by-side so that they are in contact with or positioned near each other in a so-called side-by-side configuration.

Housing 1 of the controller CA and housing 21 of the controller CB internally incorporate bus bar portions 2 and 22 for PN terminal connection, respectively. The bus bar portion 2 of the one controller CA and the bus bar portion 22 of the other controller CB have the same configuration.

In the bus bar portion 2 (22) of the controller CA (CB), plastic bus bar holders 3 and 4 (23 and 24) are disposed on both the left and right sides, as illustrated in FIG. 2 to FIG. 4.

The bus bar holders 3 and 4 (23 and 24) have barriers 3a and 4a (23a and 24a) for preventing electric shock on both sides, and have holder anchor portions 3b and 4b (23b and 24b), which are fixed to the housing 1 (21) by bolts (not shown), on the lower inner side (rear side). Further, both the left and right ends of an upper common bus bar 5 (25) and a lower common bus bar 6 (26) are respectively secured to the left and right bus bar holders 3 and 4 (23 and 24) secure by means of bolts 11a, 11b, 12a, and 12b (31a, 31b, 32a, and 32b). Note that bolt through-holes (not shown) are formed on both left and right end portions of the upper common bus bar 5 (25) and the lower common bus bar 6 (26), and bolt holes (not shown) are formed on the bus bar holders 3 and 4 (23 and 24). Further, the positions of the upper common bus bar 5 (25) and the lower common bus bar 6 (26) are staggered in the front-back direction with the lower common bus bar 6 (26) disposed further toward the rear than the upper common bus bar 5 (25), for example, to eliminate any hindrance to connection.

Further, grooves 5a, 5b, 6a, and 6b (25a, 25b, 26a, and 26b) are formed in the horizontal direction (longitudinal direction) on the upper and lower surfaces of the upper common bus bar 5 (25) and the lower common bus bar 6 (26), and protrusions shorter in the front-back direction than the grooves 5a, 5b, 6a, and 6b (25a, 25b, 26a, and 26b) are formed on the corresponding areas of the bus bar holders 3 and 4 (23 and 24), with the protrusions inserted into the grooves with gaps in the front-back direction. The upper common bus bar 5 (25) and the lower common bus bar 6 (26) are movable in the front-back direction in an amount equivalent to this gap. Note that, only protrusions 3c, 3d, 3e and 3f (23c, 23d, 23e, and 23f) of the bus bar holder 3 (23) are shown in FIG. 4.

The upper common bus bar 5 (25) and the lower common bus bar 6 (26) are tightened and secured to the bus bar holder 3 (23) by the bolts 11a and 12a (31a and 32a), with an upper rotating bus bar 7 (27) and a lower rotating bus bar 8 (28) used for connection and described later positioned therebetween.

The upper rotating bus bar 7 (27) and the lower rotating bus bar 8 (28) are disposed on one side of the upper common bus bar 5 (25) and the lower common bus bar 6 (26), such as on the respective ends thereof on the left side in the FIG. 1 to FIG. 3, for example. The upper rotating bus bar 7 (27) and the lower rotating bus bar 8 (28) comprise hook portions 7*a* and 8*a* (27*a* and 28*a*) and have bolt through-holes (not shown) formed. The bolts 11*a* and 12*a* (31*a* and 32*a*) are inserted with washers through the bolt through-holes, positioning the upper rotating bus bar 7 (27) and the lower rotating bus bar 8 (28) between the head portions of these bolts 11*a* and 12*a* (31*a* and 32*a*) and the upper common bus bar 5 (25) and the lower common bus bar 6 (26), respectively. On the other side of the upper common bus bar 5 (25) and the lower common bus bar 6 (26), such as on the respective ends thereof on the right side of the FIG. 1 to FIG. 3, such rotating bus bars are not installed. Rather, the bolts 11*b* and 12*b* (31*b* and 32*b*) inserted through washers are inserted through the bolt through-holes of the upper common bus bar 5 (25) and the lower common bus bar 6 (26), respectively, and threadably mounted to the bolt holes of the bus bar holder 4 (24). Note that the washers shown include only a washer 11*aa* (31*aa*) positioned in the area of the upper rotating bus bar 7 (27), and a washer 12*aa* (32*aa*) positioned in the area of the lower rotating bus bar 8 (28).

The upper common bus bar 5 (25) is connected with a first internal connection bus bar 9*a* (29*a*), which serves as an upper connecting body for internal connection, and this first internal connection bus bar 9*a* (29*a*) is connected to a second internal connection bus bar 9*b* (29*b*) as an upper connecting body for internal connection, as illustrated in FIG. 2.

Further, the lower common bus bar 6 (26) is connected with a third internal connection bus bar 10*a* (30*a*) as an lower connecting body for internal connection, and this third internal connection bus bar 10*a* (30*a*) is connected to a fourth internal connection bus bar 10*b* (30*b*) as an lower connecting body for internal connection, as illustrated in FIG. 2 and FIG. 4.

The first internal connection bus bar 9*a* (29*a*), the second internal connection bus bar 9*b* (29*b*), the third internal connection bus bar 10*a* (30*a*), and the fourth internal connection bus bar 10*b* (30*b*) each have elasticity and are capable of following the movement of the upper common bus bar 5 (25) and lower common bus bar 6 (26) in the front-back direction by bending.

With the controllers of such a configuration, the upper common bus bar 5 (25) and the lower common bus bar 6 (26) of the respective controllers are connected as follows.

Note that both common bus bars are connected using the same method, and the following describes the connection of the upper common bus bar 5 (25).

First, the barrier 4*a* or the barrier 24*a* positioned on the side that the controllers CA and CB are adjacent to each other, is removed, thereby clearing away the barriers between the space occupied by the bus bar portions 2 of the controller CA and the space occupied by the bus bar portions 22 of the controller CB, and creating successive spaces that make it possible to connect the bus bar portions 2 and 22.

Next, the upper bolt 31*a* of the controller CB is loosened so that the upper rotating bus bar 27 and the upper common bus bar 25 can be moved in the front-back direction. Further, the upper bolt 11*b* of the controller CA is also loosened, creating a space between the washer and upper common bus bar 5 in which the hook portion 27*a* of the rotating bus bar 27 inserts.

Next, the upper rotating bus bar 27 of the controller CB is rotated clockwise to hook the hook portion 27*a* from downward of the upper common bus bars 5, 25 onto the bolt 11*b* of the controller CA (corresponds to a first mode). At this time, the upper rotating bus bar 27 and the upper common bus bar 25 can be floating and move freely in the front-back direction in an amount equivalent to the gap between the grooves 25*a* and 25*b* and the protrusion portions 23*c* and 23*d*, respectively, and the upper common bus bar 5 of the controller CA can similarly be floating and move freely in the front-back direction in an amount equivalent to the gap between the grooves 5*a* and 5*b* and the protruding portions (not shown), respectively, making it possible to reliably insert between the upper common bus bar 5 and the washer of the controller CA and hook onto the bolt 11*a* the hook portion 27*a* of the upper rotating bus bar 27, even if tolerance or machining errors exist with components such as the bus bar holders 4 and 23, the upper common bus bars 5 and 25, or the upper rotating bus bar 27. With this arrangement, it is possible to maintain a sufficient contact surface area between the upper rotating bus bar 27 and the upper common bus bar 5.

The lower side of the bus bar portions 2 and 22 where the holder anchor portions 3*b*, 4*b*, 23*b*, and 24*b* are provided is spacious, allowing the hook 27*a* of the upper rotating bus bar 27 to be rotated to the lower side from the upper common bus bars 5, 25 and hook onto the bolt 11*a* where this extra space exists, making it possible to suppress the height dimension of the bus bar portions 2 and 22 and efficiently utilize space.

Note that, during the rotation of the hook portion 27*a* of the upper rotating bus bar 27, the lower common bus bars 6 and 26 are disposed on a rear portion than the upper common bus bars 5 and 25, preventing the lower common bus bars 6 and 26 from interfering with the rotation of the upper rotating bus bar 27.

In this state, the two bolts 11*b* and 31*a* are alternately tightened, reliably connecting the two upper common bus bars 5 and 25 via the upper rotating bus bar 27 (corresponds to a second mode).

Once the upper common bus bar 5 of the controller CA and the upper common bus bar 25 of the controller CB are connected, the lower common bus bar 6 of the controller CA and 26 of the controller CB are connected.

The method for this connection are the same as those for the upper common bus bars 5 and 25 described above, and descriptions thereof will be omitted.

Note that each of the bus bars is made of a plate member or metal material having excellent electrical characteristics.

Additionally, while the rotating bus bars are respectively disposed on the upper left side in the FIG. 1 to FIG. 3 in the above embodiment, the bus bars may be disposed on the right side.

Further, the internal connection bus bars may be replaced with cables (electric wires) having elasticity.

What is claimed is:
1. A control unit comprising:
    a plurality of controllers that are disposed side by side so that the controllers are in contact with each other or are near each other, each of the controllers comprising:
    an upper common bus bar;
    a lower common bus bar;
    a left bus bar holder disposed on a left side of said upper common bus bar and said lower common bus bar;
    a right bus bar holder disposed on a right side of said upper common bus bar and said lower common bus bar;
    an upper rotating bus bar; and
    a lower rotating bus bar, wherein
said upper common bus bar has a groove formed on an upper surface and a groove formed a lower surface along a left and right longwise direction,
said lower common bus bar has a groove formed on an upper surface and a groove formed a lower surface along the left and right longwise direction,
said left bus bar holder and said right bus bar holder tighten and secure said upper common bus bar and said lower common bus bar,
each of said left bus bar holder and said right bus bar holder has protrusions respectively coming into said groove and forming a gap along the front-back and widthwise direction of said upper common bus bar and said lower common bus bar,
said upper rotating bus bar comes in contact with an end of said upper common bus bar in one side in a freely rotating manner, and is tightened and secured to said left bus bar holder or said right bus bar holder that is in said one side as well as said upper common bus bar, and
said lower rotating bus bar comes in contact with an end of said lower common bus bar in one side in a freely rotating manner, and is tightened and secured to said left bus bar holder or said right bus bar holder that is in said one side as well as said lower common bus bar.

2. The control unit according to claim 1, wherein:
in each of the controllers, said upper common bus bar and said lower common bus bar are respectively disposed on different positions with each other along the front-back and widthwise direction thereof.

3. The control unit according to claim 1, wherein:
in each of the controllers, said upper rotating bus bar is capable of rotating downward and said lower rotating bus bar is capable of rotating downward.

4. The control unit according to claim 1, wherein:
each of the controllers further comprises:
a upper connecting body for internal connection that is connected to said upper common bus bar and the corresponding power supply line inside the controller; and
a lower connecting body for internal connection that is connected to said lower common bus bar and the corresponding power supply line inside the controller, and
each of said upper connecting body and said lower connecting body has elasticity.

5. The control unit according to claim 1, wherein:
the plurality of controllers are disposed side by side so that said upper rotating bus bar of one controller is connected in contact with said upper common bus bar of another controller and said lower rotating bus bar of one controller is connected in contact with said lower common bus bar of another controller.

* * * * *